United States Patent
Fung et al.

(10) Patent No.: US 8,580,879 B2
(45) Date of Patent: Nov. 12, 2013

(54) RESIN COMPOSITION OF HIGH THERMAL CONDUCTIVITY AND HIGH GLASS TRANSITION TEMPERATURE (TG) AND FOR USE WITH PCB, AND PREPREG AND COATING THEREOF

(75) Inventors: Dein-Run Fung, Taipei (TW); Te-Chao Liao, Taipei (TW); Hao-Sheng Chen, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 133 days.

(21) Appl. No.: 13/341,015

(22) Filed: Dec. 30, 2011

(65) Prior Publication Data

US 2012/0100770 A1 Apr. 26, 2012

Related U.S. Application Data

(63) Continuation-in-part of application No. 12/318,680, filed on Jan. 6, 2009, now abandoned.

(51) Int. Cl.
*C08K 3/00* (2006.01)
*C08K 3/38* (2006.01)

(52) U.S. Cl.
USPC .............. 524/404; 524/433; 524/442

(58) Field of Classification Search
USPC .............. 524/404.43, 432, 433, 442
See application file for complete search history.

(56) References Cited

U.S. PATENT DOCUMENTS

| | | | |
|---|---|---|---|
| 3,992,358 | A | 11/1976 | Schinabeck |
| 5,137,940 | A | 8/1992 | Tomiyoshi et al. |
| 5,965,673 | A | 10/1999 | Hermansen et al. |
| 6,221,509 | B1 | 4/2001 | Hirano et al. |
| 6,548,159 | B2 | 4/2003 | Tsai et al. |
| 2004/0188676 | A1 | 9/2004 | Osuga |
| 2004/0198925 | A1 | 10/2004 | Morita et al. |
| 2005/0152773 | A1 | 7/2005 | Sumita et al. |
| 2006/0046327 | A1 | 3/2006 | Shieh et al. |
| 2006/0194910 | A1 | 8/2006 | Miyatake et al. |
| 2006/0286365 | A1 | 12/2006 | Lee et al. |

*Primary Examiner* — Terressa Boykin
(74) *Attorney, Agent, or Firm* — Bacon & Thomas, PLLC

(57) ABSTRACT

A resin composition includes solid brominated epoxy resin of 20-70 wt %, a hardener of 1-10 wt %, a promoter of 0.1-10 wt %, inorganic powder of 0.01-20 wt %, high thermal conductivity powder of 5-85 wt % closest packed by Horsfield packing model and a processing aid of 0-10 wt %; the resin composition possesses high glass transition temperature ranged from 169° C. to 235° C. measured by DSC, high thermal conductivity ranged from 5.7 W/m·K to 14.2 W/m·K, and excellent heat resistance as well as flame retardancy. The resin composition, which acts as a dielectric layer of a printed circuit board so as to endow the PCB with high thermal conductivity, is a high thermal conductivity prepreg formed by retting or a high thermal conductivity coating formed by coating. As a result, prompt dissipation of heat generated by electronic components on the PCB is achievable so that service life and stability of the electronic components are improved.

10 Claims, 1 Drawing Sheet

US 8,580,879 B2

RESIN COMPOSITION OF HIGH THERMAL CONDUCTIVITY AND HIGH GLASS TRANSITION TEMPERATURE (TG) AND FOR USE WITH PCB, AND PREPREG AND COATING THEREOF

CROSS REFERENCE TO RELATED APPLICATIONS

This application is a CIP of U.S. patent application Ser. No. 12/318,680 filed Jan. 6, 2009, now pending.

BACKGROUND OF THE PRESENT INVENTION

1. Field of the Present Invention

The present invention relates to a resin composition, and more particularly, to a resin composition characterized by high thermal conductivity and high glass transition temperature (Tg) for forming a dielectric layer on a printed circuit board (PCB).

2. Description of Prior Art

U.S. Pat. No. 6,512,075, titled "High Tg brominated epoxy resin for glass fiber laminate" and assigned to the same assignee of the present invention, provides a brominated epoxy resin which consists of tetrabromobisphenol-A and at least one resin, such as multifunctional phenol-benzaldehyde epoxy resin, difunctional epoxy resin, or difunctional bromine-containing epoxy resin. The brominated epoxy resin is of average molecular weight (Mw) of 1500-4000, dispersive index of molecular weight between 1.5 and 4.0 (Mw/Mn ratio), epoxy equivalent weight (EEW) of 300-450 g/eq, and glass transition temperature (Tg) of 150-190° C.

This brominated epoxy resin manifests broad working window in laminating process and is applicable to glass fiber laminate. The laminate has high Tg and is highly heat-resistant, and is applicable to electron material with high performance.

Recently, with the trend toward high-density integrated circuit configuration, accumulation of heat generated from electronic components tends to aggravate and thus conventional epoxy resin becomes inadequate for IC applications in respect of thermal conductivity and glass transition temperature (Tg). Hence, this invention is aimed at further improvement of the epoxy resin of the above-mentioned US Patent in order to provide resin composition characterized by high thermal conductivity and high glass transition temperature (Tg) and adapted for forming a dielectric layer on a PCB efficient in insulation and heat dissipation, so as to endow the PCB with high thermal conductivity.

SUMMARY OF THE INVENTION

The primary objective of the present invention is to provide a resin composition, based on the resin composition, comprising solid brominated epoxy resin of 20-70 wt %, a hardener of 1-10 wt %, a promoter of 0.1-10 wt %, an inorganic powder of 0.01-20 wt %, high thermal conductivity powder of 5-85 wt % and a processing aid of 0.02-10 wt % if necessarily added.

The resin composition features, in addition to excellent heat resistance and flame retardancy, a high thermal conductivity ranged from 5.7 W/m·K to 14.2 W/m·K, preferably from 8.4 W/m·K to 14.2 W/m·K, as well as a high glass transition temperature (Tg) ranged from 169° C. to 235° C. as measured by differential scanning calorimetry (DSC).

The resin composition is a prepreg formed by retting and characterized by high thermal conductivity. Alternatively, the resin composition is a coating formed by coating and characterized by high thermal conductivity.

The prepreg or coating of high thermal conductivity is adapted for forming a dielectric layer on a printed circuit board (PCB) to endow the PCB with high thermal conductivity. As a result, efficient dissipation of heat generated by electronic components on the PCB is achievable so that service life as well as stability of the electronic components are improved.

BRIEF DESCRIPTION OF THE DRAWINGS

The invention as well as a preferred mode of use, further objectives and advantages thereof, will best be understood by reference to the following detailed description of illustrative embodiments when read in conjunction with the accompanying drawings, wherein.

DETAILED DESCRIPTION OF THE PREFERRED EMBODIMENT

Figure 1:
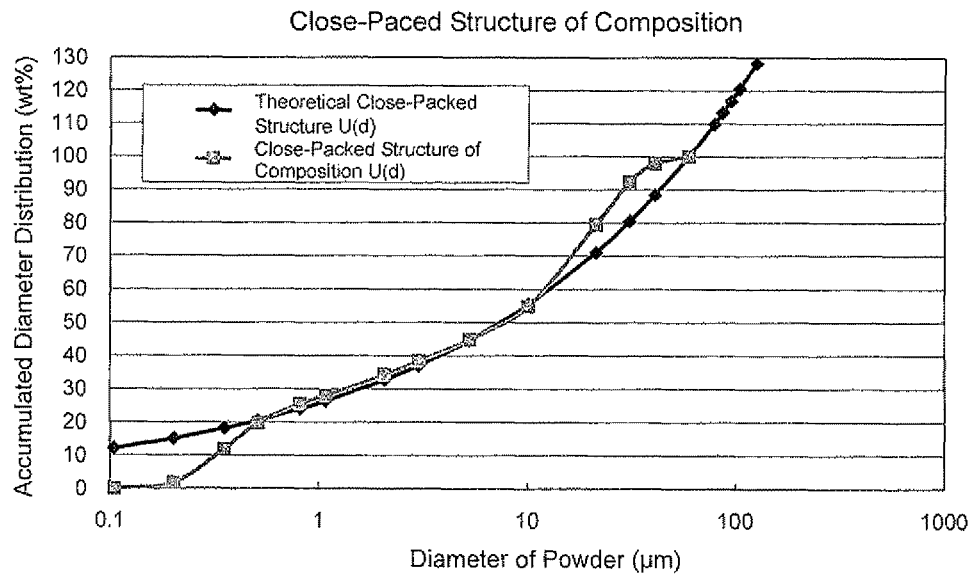
FIG. 1 is a graph showing an actual and a theoretical close-packed model of different-sized spherical aluminum oxide powders A and B (ration of A:B=9:1) closest packed in form of highest density model by Horsfield Packing Model.

The present invention discloses resin composition characterized by high glass transition temperature (Tg) and high thermal conductivity and adapted for forming a dielectric layer on a printed circuit board (PCB) so as to promptly dissipate heat generated by operating electronic components on the PCB and thus improve service life as well as stability of the electronic components.

The disclosed resin composition of the invention has a high thermal conductivity ranged from 5.7 W/m·K to 14.2 W/m·K, preferably from 8.4 W/m·K to 14.2 W/m·K, the best mode from 10.2 W/m·K to 14.2 W/m·K, as well as a high glass transition temperature (Tg) ranged between 169° C. and 235° C. as measured by differential scanning calorimetry (DSC), which comprises:

(1) solid brominated epoxy resin of 20-70 wt % based on the resin composition, wherein the brominated epoxy resin is the same brominated epoxy resin taught by U.S. Pat. No. 6,512,075 and is a product of synthesis using tetrabromobisphenol-A and at least a resin, such as multifunctional phenol-benzaldehyde epoxy resin, difunctional epoxy resin, or difunctional bromine-containing epoxy resin, in which a ratio among the resins is subject to change so as to provide desired machinability, physical properties, and form of the resultant dielectric layer, e.g. prepreg or resin coated copper;

(2) a hardener of 1-10 wt % based on the resin composition;

(3) a promoter of 0.1-10 wt % based on the resin composition for promoting cross linking reaction between said brominated epoxy resin and hardener wherein the rate of the reaction depends on the amount of the promoter used;

(4) inorganic powder of 0.01-20 wt % based on the resin composition for providing enhanced rigidity to the resin composition after the resin composition is cured;

(5) high thermal conductivity powder of 5-85 wt % based on the resin composition, preferably 65-85 wt %, wherein high thermal conductivity powder less than 5 wt % of the resin composition results in resin composition with low thermal conductivity and yet high thermal conductivity powder greater than 85 wt % of the resin composition results in resin composition with compromised machinability and physical properties; and (6) a processing aid of 0.02-10 wt % based on the resin composition, if necessarily added to improve machinability, mechanical and electrical properties, thermal properties, and photostability of the resin composition.

The hardener for the resin composition of the present invention is at least one of amines, acid anhydrides, phenolic resins, polythiol compounds, isocyanate compounds, block isocyanate compounds, or alkyd resins, and is preferably at least one selected from the group consisting of amines, phenolic resins, acid anhydrides, and combinations thereof.

The hardener selected from the amines is one of aliphatic amines (e.g. diethylenetriamine, triethylene-tetramine, tetraethylenepentamine, diethylamino propylamine, or ethanolamine), polyamide-polyamsne, alicyclic compounds (e.g. bis (4-amino-3-methylcyclohexyl)methane, bis(4-diaminocyclohexane)methane), aryls (e.g. m-xylylenediamine, dimido diphenyl methane, dimido diphenyl sulfone, or meta phenylene diamine), dicyanodiamide, adipic dihydrazide, primary amines, secondary amines and tertiary amines.

The hardener selected from the acid anhydrides is one of phthalic anhydride, tetrahydrophthalic anhydride, hexahydrophthalic anhydride, methyl tetrahydrophthalic anhydride, methyl hexahydrophthalic anhydride, nadic methyl anhydride, dodenenyl succinic anhydride, chlorendic anhydride, pyromellitic dianhydride, benzophenone tetracarboxylic dianhydride, trimellitic anhydride, methylcyclohexene tetracarboxylic anhydride, trimellitic anhydride and polyazelaic polyanhydride.

The promoter used in the resin composition is at least one selected from the group consisting of tertiary amines and salts thereof, quaternary ammonium salts, 2,4,6-tris(dimethylaminomethyl)phenol, dimethyl benzylamine, imidazoles (e.g. 2-ethyl-4-methylimidazole, 2-phenylimidazole and 1-benzyl-2-methylimidazole), tertiary amyl phenol ammonium, monophenols or polyphenols (e.g. phenols or salicylic acid), boron trifluoride and organic complex compounds thereof (e.g. boron trifluoride ether complex, boron trifluoride amine complex or boron trifluoride monoethyl amine complex), phosphoric acid and triphenyl phosphite, wherein the promoter is preferably one of tertiary amines, imidazoles and combinations thereof.

The inorganic powder is at least one selected from the group consisting of $SiO_2$, $TiO_2$, $Al(OH)_3$, $Mg(OH)_2$, $CaCO_3$ and fumed silica in form of sphere or irregular shapes. An average diameter of the inorganic powder is preferably between 0.01 and 20 micron. Therein, the fumed silica is added in form of nano-sized silica powder having an average diameter ranging from 1 to 100 nm. The fumed silica is preferably added in an amount between 0.1 and 10 wt % based on the resin composition and when more than 10 wt % of fumed silica is added, viscosity of the resultant resin composition significantly increases to the detriment of its machinability.

The high thermal conductivity powder in the resin composition is at least one selected from the group consisting of metal nitrides, metal oxides, carbides and corundum.

More particularly, the metal nitrides include aluminum nitride, boron nitride, and silicon nitride. The metal oxides include aluminum oxide, magnesium oxide, and zinc oxide. The carbides include silicon carbide and boron carbide. Whereas, the high thermal conductivity powder is preferably aluminum oxide, magnesium oxide, zinc oxide, boron nitride, aluminum nitride, silicon nitride or silicon carbide while more preferably being aluminum oxide or boron nitride having low dielectric constant or low hardness.

The high thermal conductivity powder is added in form of dust, beads, fibers, chips or flakes while different forms of the high thermal conductivity powder is used in cooperation.

When added in the form of dust, the high thermal conductivity powder has an average diameter ($D_{50}$) of 0.05-50 micron, preferably of 0.1-20 micron, and more preferably of 0.1-10 micron. When added in the form of fibers, the high thermal conductivity powder has an average diameter of 0.1-10 micron, and a length-diameter ratio greater than 3, preferable an average diameter of 0.1-5 micron, and a length-diameter ratio greater than 10. The fiber smaller than 0.1 micron in diameter is too small to get well blended into the resin composition while the fiber greater than 10 micron in diameter adversely affects appearance of the resin composition in respect of esthetics.

For packing of different-sized high thermal conductivity powders that are closest packed in form of highest density model in the resin composition of the present invention, a so-called Horsfield Packing Model is introduced, for example, which can refer to the "Handbook of Powder Science & Technology" (hereafter HPST) written by Muhammed. E. Fayed and Lambert Otten, 2nd Edition, CHAPMAN & HALL: New York (1997). The HPST discloses that the Horsfield Packing Model is a regular packing of different-sized spheres wherein interspaces among primary spheres are filled with smaller secondary spheres, the interstices between the secondary spheres are filled with even smaller tertiary spheres, and so on until sixth largest spheres are used to fill the interstices of the fifth largest spheres (HPST: Pages 98-99). At each level, the model defines a coordination number, the number of spheres a given sphere touches, and the ratio of sphere size relative to the primary spheres (HPST: Table 4.1, 4.3).

By compliance of Horsfield Packing Model the high thermal conductivity powders which are closest packed in form of highest density model (or referred to as "maximum fill ratio") in the resin composition of the present invention is 85 wt %. When there is 85 wt % of high thermal conductivity powder in the resin composition, an unexpected effect is that the resin composition remains its broad working window in laminating process high Tg, excellent heat resistance and good peel strength. By comparison, a conventional resin composition composed of o-cresol formaldehyde novolac epoxy resin tends to have its machinability and physical properties adversely affected when the high thermal conductivity powder contained therein is more than 65 wt %. Particularly, the melt viscosity of the conventional resin composition is going to become too high or its rheological property is become too poor, when the resin composition contains high thermal conductivity powder therein if up to 80 wt % and also packed by non-compliance of Horsfield Packing Model, resulted in that a Copper Clad Laminate (CCL) if covered with a layered coating made of the above-mentioned resin composition shall not be applicable used in industry, since the surface of the layered coating is leading to be non-uniform and filler agglutinated due to poor rheological property of the resin composition.

The processing aid used in the resin composition of the present invention is at least one selected from the group consisting of stuffing, coupling agents, reinforcing fillers, plasticizers, dispersing agents, anti-oxidants, heat and light stabilizers, flame retardant agents, pigments and dyes.

Coupling agents are used in the resin composition for improving interfacial surface affinity between the resin and the inorganic powder and/or the high thermal conductivity powder. For example, a kind of γ-glycidoxypropyl-trimethoxysilane (KBM403 from Shin-Etsn Chemical Co., Ltd.) is commonly used as a coupling agent and is directly added into the resin composition. Alternatively, the inorganic powder or the high thermal conductivity powder and the coupling agents are preprocessed before used to form the resin composition.

In practical applications, it is possible to prepare the resin composition in the form of a high thermal conductivity prepreg formed by retting or a high thermal conductivity coating formed by coating. The prepreg or coating is successively used as a dielectric layer of a printed circuit board (PCB) so as to endow the PCB with high thermal conductivity.

The prepreg is constructed upon glass fiber cloth that acts as a substrate to be rested with the resin composition. The coating comprises a metal foil (sheet) or a plastic film as a substrate to be coated with the resin composition. Therein, the metal foil (sheet) is selected from the group consisting of an FR-4 substrate, a copper foil (sheet), an aluminum foil (sheet) and a tin foil (sheet) while the plastic film is selected from the group consisting of a polyester film, a polyolefin film, a polyvinyl chloride film, a polytetrafluoroethylene film and a polyurethane film.

When the high thermal conductivity prepreg or coating is applied to a PCB as a dielectric layer, the PCB is endowed with high thermal conductivity and additionally possesses the following advantageous features:
1. compact volume;
2. enhanced current density;
3. providing improved thermal properties and mechanical properties to products using the PCB;
4. contributing to better durability of products using the PCB;
5. saving use of cooling fins and other thermal dissipation components in products using the PCB; and
6. superior mechanical durability to ceramic substrate that is relatively fragile.

While the following examples and comparative examples will be given below for illustrating the effects of the present invention, it is to be understood that the scope of the present is not limited to the recited examples.

The high Tg brominated epoxy resin taught by U.S. Pat. No. 6,512,075 is added with at least one said kind of the high thermal conductivity powder so as to obtain the resin composition of high thermal conductivity and high Tg described in the following examples. The resin composition is used to form a copper foil substrate by any applicable process known in the art. For example, dicydiamide or polyhydric phenolic is employed as a hardener of the composition. When so used, dicydiamide is added in an amount of 2-8 phr, preferably 2-4 phr, and polyhydric phenolic is such added that an equivalent ratio between phenol OH groups and epoxy groups ranges from 0.5 to 1.5, preferably from 0.9 to 1.1. Imidazoles or tertiary amines are used as promoters while solvents (applicable examples including N,N-Dimethylformamide (DMF), acetone and butanone) are added to adjust viscosity of the resin composition. Afterward, the resin composition resin is used to ret a glass fiber cloth or to coat a copper foil, and then the retted glass fiber cloth or coated copper foil is heated and dried so as to form a prepreg or an RCC (resin coated copper foil). The prepreg or RCC is later laminated with a copper foil or sandwiched by two copper foils so as to form a copper foil substrate.

Example 1

Allowing 20.2 parts by weight of bisphenol-A epoxy (with epoxy equivalent weight (EEW) of 186 g/eq, available from Nan Ya Plastics Corporation, Taiwan, NPEL-128E), 49.5 parts by weight of multifunctional phenol-benzaldehyde epoxy resin and 21.2 parts by weight of tetrabromobisphenol-A (TBBA) to react at 170° C. for 120 min and then cooled to 130° C. Add 7 parts of tetrabromobisphenol-A epoxy resin (EEW=390 g/eq, available from Nan Ya plastics corporation, Taiwan, NPEB-400) and 2 parts of tetra functional epoxy (available from Nan Ya plastics Corporation, Taiwan, NPPN-431), then mixed uniformly, therefore the brominated epoxy resin "EP-1" is obtained.

Making the brominated epoxy resin "EP-1" dissolved into 20 wt % acetone to obtain 80 wt % solution"EP-1", then epoxy resin "EP-1" such obtained possesses EEW of 378 g/eq, Mw of 3366, and bromine-containing content of 15.8 wt %.

Making 100 parts of "EP-1", 2.5 parts of dicydiamide and 0.05 parts of 2-phenyl imidazole, which are dissolved in DMF, blend with 185.7 parts of high thermal conductivity powder, thus 65 wt % brominated epoxy resin "EP-1" is produced. Therein the high thermal conductivity powder is preprocessed with 1.9 parts of coupling agent KBM403 (produced from Shin-Etsn Chemical Co., Ltd.) or other auxiliary agents such as dispersing agents or light stabilizers is added, if necessary.

Therein, a closest packed in form of highest density model of the high thermal conductivity powder (185.7 parts) added into the liquid resin is derived through Horsfield Packing Model. The obtained specific structure contains 33.4 parts of spherical aluminum oxide powder A (with average diameter of $D_{50}$=5 μm), 3.7 parts of spherical aluminum oxide powder B (with average diameter of $D_{50}$=0.5 μm), and 148.6 parts of boron nitride (with average diameter of $D_{50}$=5.5 μm).

Rating a glass fiber cloth (available from Nan Ya Plastics Corporation, Taiwan, grade 1080) in the above-mentioned resin, then drying a few minutes at 170° C. (retting machine), by controlling the drying time to regulate minimum melt viscosity of dried prepreg to 4000-10000 poise, then piling up 8 pieces of prepreg laminate between two copper foils with thickness of 35 μm, keeping them at the pressure of 25 kg/cm2 and the temperature of 85° C. for 20 minutes, gradually heated up to 185° C. at the heating rate of 5° C./min, keeping them at 185° C. for 120 minutes, and then gradually cooling them to 130° C. so as to obtain the copper foil substrate with thickness of 1.6 mm.

The obtained copper foil substrate is tested and results of tests are given in Table 1.

Example 2

Replacing the amount of the high thermal conductivity powder added in the resin of Example 1 with 400 parts by weight and using Horsfield Packing Model to get the closest packed in form of highest density model of the high thermal conductivity powder, the obtained specific structure contains 72 parts of spherical aluminum oxide powder A (with average diameter of $D_{50}$=5 μm), 8 parts of spherical aluminum oxide powder B (with average diameter of $D_{50}$=0.5 μm), and 320 parts of boron nitride (with average diameter of $D_{50}$=5.5 μm).

A comparison between the actual packing curve and the theoretical packing curve of aluminum oxide powder closest packed by Horsfield Packing Model is shown in FIG. 1.

The obtained copper foil substrate is also tested and results of tests are given in Table 1 and an appearance inspection for the copper foil substrate is tested as shown in Table 2.

Example 3

Making the resin as described in Example 2, adjusting solid content of the resin to 75 wt % and applying the resin to a copper foil with thickness of 35 µm, thereby the RCC (resin coated copper foil) with coating thickness of 100 µm is obtained. Then another copper foil with thickness of 35 µm is laminated with the resin under lamination conductions as provided in Example 1. The obtained copper foil substrate is also tested and results of tests are given in Table 1.

Example 4

Replacing the amount of the high thermal conductivity powder added in the resin of Example 1 with 400 parts by weight and using Horsfield Packing Model to get the closest packed in form of highest density model of the high thermal conductivity powder, the obtained specific structure contains 72 parts of spherical aluminum oxide powder A (with average diameter of $D_{50}$=5 µm), 8 parts of silicon dioxide ($SiO_2$) powder (with average diameter of $D_{50}$=0.5 µm), and 320 parts of boron nitride (with average diameter of $D_{50}$=5.5 µm).

The obtained copper foil substrate is also tested and results of tests are given in Table 1.

Example 5

Making 100 parts of "EP-1" prepared as Example 1, 13.1 parts of diamino diphenyl sulfone and 0.1 parts of 2-phenyl imidazole, which are dissolved in DMF, blend with 641 parts of high thermal conductivity powder, thus adjusting solid content of the resin to 75 wt % and applying the resin to a copper foil with thickness of 35 µm, thereby the RCC (resin coated copper foil) with coating thickness of 100 µm is obtained. Then another copper foil with thickness of 35 µm is laminated with the resin under lamination conductions as provided in Example 1. The obtained copper foil substrate is also tested and results of tests are given in Table 1.

And, using Horsfield Packing Model to get the closest packed in form of highest density model of the high thermal conductivity powder, the obtained specific structure contains 123.5 parts of spherical aluminum oxide powder A (with average diameter of $D_{50}$=5 µm), 13.7 parts of spherical aluminum oxide powder B (with average diameter of $D_{50}$=0.5 µm), 548.8 parts of boron nitride (with average diameter of $D_{50}$=5.5 µm), and 8 parts of silicon dioxide ($SiO_2$) powder (with average diameter of $D_{50}$=0.5 µm). A comparison between the actual packing curve and the theoretical packing curve of aluminum oxide powder is shown in FIG. 1.

Comparative Example 1

Allowing 37 parts by weight of bisphenol-A epoxy (EEW=186 g/eq, available from Nan Ya Plastics Corporation, Taiwan, NPEL-128E), 10 parts by weight of ortho cresol multifunctional phenolic epoxy resin (EEW=210 g/eq, available from Nan Ya Plastics Corporation, Taiwan, NPCN-704), 26 parts of tetrabromobisphenol-A (TBBA) and 5 parts of tetra functional epoxy resin (available from Nan Ya plastics corporation, Taiwan, NPPN-431) to react at 170° C. for 120 min, and then be cooled to 130° C. Then, add 15 parts of bisphenol-A epoxy (with epoxy equivalent weight (EEW) of 186 g/eq, available from Nan Ya Plastics Corporation, Taiwan, NPEL-128E) and 7 parts of tetrabromobisphenol-A epoxy resin with epoxy equivalent weight (EEW) of 390 g/eq, available from Nan Ya plastics corporation, Taiwan, NPEB-400), then mixed uniformly, thereby the brominated epoxy resin "EP-2" is obtained. Making the brominated epoxy resin "EP-2" dissolve into 20 wt % acetone to obtain 80 wt % solution "EP-2", then epoxy resin "EP-2" such obtained possesses epoxy equivalent weight (EEW) of 354 g/eq, Mw of 2800, and bromine-containing content of 18.7%.

Adding the high thermal conductivity powder into the epoxy resin "EP-2" with 33.4 parts of spherical aluminum oxide powder A (with average diameter of $D_{50}$=5 µm), 3.7 parts of spherical aluminum oxide powder 13 (with average diameter of $D_{50}$=0.5 µm), and 148.6 parts of boron nitride C (with average diameter of $D_{50}$=5.5 µm), afterward, a copper foil substrate is obtained thereupon through the method as described in Example 1.

The obtained copper foil substrate is also tested and results of tests are given in Table 1.

Comparative Example 2

Making the resin as described in Comparative Example 1, but adding 400 parts of the high thermal conductivity powder, which includes 72 parts of spherical aluminum oxide powder (with average diameter of $D_{50}$=5 µm), 8 parts of spherical aluminum oxide powder B (with average diameter of $D_{50}$=0.5 µm), and 320 parts of boron nitride (with average diameter of $D_{50}$=5.5 µm), afterward, a copper foil substrate is obtained thereupon through the method as described in Example 1

The obtained copper foil substrate is also tested and results of tests are given in Table 1.

Comparative Example 3

Making the resin as described in Example 2, but adding the 400 parts of the high thermal conductivity powder with boron nitride only, afterward, a copper foil substrate is obtained thereupon through the method as described in Example 1. The obtained copper foil substrate is also tested and results of tests are given in Table 1.

Comparative Example 4

Making the resin as described in Example 2, but using different high thermal conductivity powder by adding 80 parts spherical aluminum oxide powder DAW-300 (Denka, Japan, DAW-45/DAW-5=1/1, average diameter $D_{50}$=4.4 µm) commercially available with different diameters blended and 320 parts of boron oxide, and the resin composition is obtained.

Figure 2:
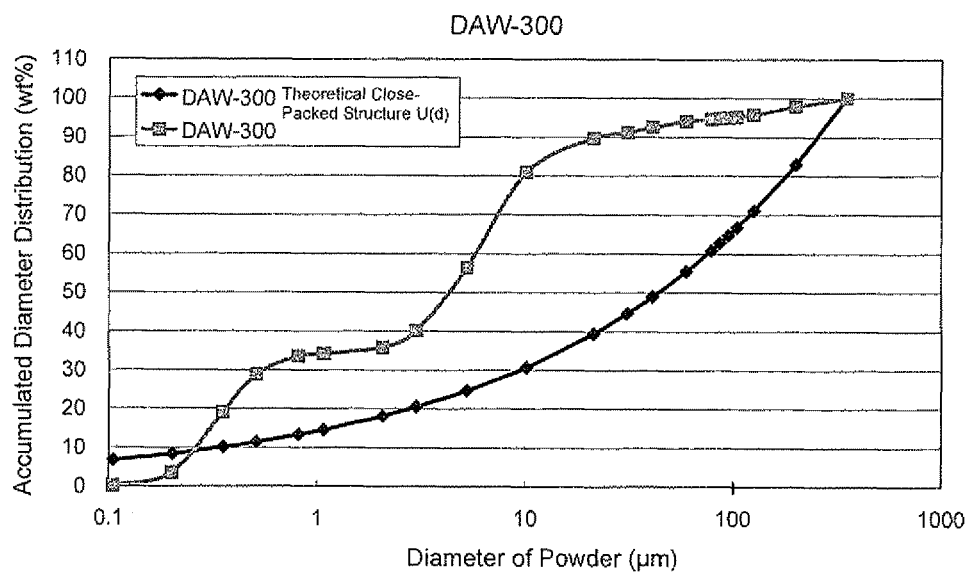
FIG. 2 is a graph showing an actual close-packed model of commercially available spherical aluminum oxide powder (DAW-300) with different diameters blended and a theoretical close-packed model by Horsfield Packing Model thereof.

A comparison between the actual packing curve of commercially available aluminum oxide powder DAW-300 and the theoretical packing curve if closet packed by Horsfield Packing Model thereof is shown in FIG. 2.

CONCLUSION

By comparing test results of Examples 1-5 and Comparative Examples 1-4, the following conclusions are derived.
1. Examples 1 and 2 show that when 185.7 parts and 400 parts are added in to "EP-1" resin, respectively, the desired reactivity, broad working window in laminating process, high Tg, and excellent heat resistance of the resin composition remain without being affected, while the thermal conductivity of the resin composition is improved to 5.7 W/m·K shown in Example 1 and 8.4 W/m·K shown in Example 2, respectively.

If the RCC process is implemented by Example 3, the thermal conductivity of the resin composition is even improved to as high as 10.2 W/m·K. While the RCC process is implemented by Example 5 to take diamino diphenyl sulfone as a hardener, the thermal conductivity as well as the glass transition temperature (Tg) of the resin composition is even improved, namely, the thermal conductivity improved to as high as 10.2 W/m·K and the Tg improved to as high as 235° C. respectively.

2. Examples 1 and 2 and Comparative Examples 1 and 2 are shown as followed:
   (a) When varnish gel time=300 sec±15 sec., more promoter is added to enhance action of the cured to present better physical properties; and
   (2) When minimum melt viscosity of the epoxy resin is approximately controlled at 5500 poise±300 poise, the gel time of prepreg of "EP-1" is longer than the gel time of prepreg of "EP-2", indicating that "EP-1" synthesized with multifunctional phenol-benzaldehyde epoxy possesses a broad working window that facilitates control of resin flow during hot-pressing substrate and processes of a wide range of hot-press temperature increasing speed. Consequently, products made of the resin component are superior in applicability and uniformity of the laminated substrate is ensured.

3. FIG. 1 points out that the resin composition shown in Example 2 formulated with the high thermal conductivity powder consisting of aluminum oxide powders A and B and boron nitride determined by Horsfield Packing Model has the actual packing curve most close to the theoretical closest packing curve of FIG. 1 and has the thermal conductivity up to 8.4 W/m·K.

Likewise, the resin composition shown in Example 4 formulated with the high thermal conductivity powder consisting of aluminum oxide powders A, silicon dioxide ($SiO_2$) and boron nitride determined by Horsfield Packing Model has the thermal conductivity up to 8.4 W/m·K as same as that of the Example 2 has.

However, the resin composition formulated with commercially available blended spherical aluminum oxide powder DAW-300 shown in Comparative Example 4 has the actual packing curve so much diverging from the theoretical close packing curve of FIG. 2 and has the thermal conductivity only 6.5 W/m·K.

Although the Example 2, the Example 4 and the Comparative Example 4 has respectively shown to have the same total amount of the high thermal conductivity powder added in the resin composition, the melt viscosity of the resin composition of the Comparative Example 4 is, due to containing commercially available aluminum oxide DAW-3002 packed by non-compliance of Horsfield Packing Model, highest than that of the Example 2 and the Example 4 has, so that rheological property of the resin composition of the Comparative Example 4 is also the most poor among others.

This obviously indicates that the closer the actual packing curve close to the theoretical closest packing curve is, the more contacting points among the high thermal conductivity powders exist, that presents higher fill ratio of the high thermal conductivity powders, and better thermal conductivity of the resin composition.

4. From Table 2, the appearance inspection for the copper foil substrate made from the resin composition of Example 2 has a perfect uniform surface on which surface no filler is agglutinated, this unexpected effect of the Example 2 owned is so superior to that of the copper foil substrate made from Comparative Example 4 provided with non-uniform surface and fillers arbitrarily agglutinated on surface.

This obviously indicates that copper foil substrate of Comparative Example 4 can not be applicably used in industry.

TABLE 1

Formulas of Examples and Comparative Examples and Physical Properties of Prepreg and Substrate

| Item | Example | | | | | Comparative Example | | | |
|---|---|---|---|---|---|---|---|---|---|
| | 1 | 2 | 3 | 4 | 5 | 1 | 2 | 3 | 4 |
| Process | prepreg | prepreg | RCC | prepreg | RCC | prepreg | prepreg | prepreg | prepreg |
| EP-1 | 100 | 100 | 100 | 100 | 100 | — | — | 100 | 100 |
| EP-2 | — | — | — | — | — | 100 | 100 | — | — |
| Acetone | 25 | 25 | 25 | 25 | 25 | 25 | 25 | 25 | 25 |
| dicydianmide | 2.5 | 2.5 | 2.5 | 2.5 | — | 2.5 | 2.5 | 2.5 | 2.5 |
| Diamino diphenyl sulfone | — | — | — | — | 13.1 | — | — | — | — |
| 2-phenyl imidazole | 0.05 | 0.05 | 0.05 | 0.05 | 0.1 | 0.02 | 0.01 | 0.05 | 0.05 |
| N,N-Dimethylformamide | 130.2 | 245.6 | 212.9 | 245.6 | 251.4 | 130.2 | 212.9 | 245.6 | 245.6 |
| Aluminum Oxide A | 33.4 | 72 | 72 | 72 | 123.5 | 33.4 | 72 | — | — |
| Aluminum Oxide B | 3.7 | 8 | 8 | — | 13.7 | 3.7 | 8 | — | — |
| Aluminum Oxide DAW-300 | — | — | — | — | — | — | — | — | 80 |
| Boron Nitride C | 148.6 | 320 | 320 | 320 | 548.8 | 148.6 | 320 | 400 | 320 |
| Silicon dioxide | — | — | — | 8 | 8 | — | — | — | — |
| Coupling agent KBM403 | 1.9 | 4 | 4 | 4 | 6.9 | 1.9 | 4 | 4 | 4 |
| Varnish Gel Time (Sec.) (170° C.) | 313 | 316 | 310 | 312 | 311 | 280 | 285 | 314 | 309 |
| Prepreg's Gel Time (Sec.) (170° C.) | 130 | 132 | 131 | 133 | 131 | 93 | 91 | 133 | 128 |
| Prepreg's Minimum Melt Viscosity (poise)[*1] | 5250 | 5300 | 1200[*6] | 5100 | 1100[*6] | 5500 | 5750 | 5400 | 5800 |
| Thermal conductivity (W/m·K)[*2] | 5.7 | 8.4 | 10.2 | 8.4 | 14.2 | 3.6 | 6.1 | 6.8 | 6.5 |
| Glass Transition Temperature (° C., DSC)[*3] | 169 | 169 | 169 | 171 | 235 | 135 | 138 | 168 | 165 |
| Absorptivity % (After treated in pressure cooker for 30 mins.)[*4] | 0.18 | 0.18 | 0.18 | 017 | 0.12 | 0.23 | 0.23 | 0.19 | 0.2 |
| 288° C. Thermal stress % (After treated in pressure cooker for 30 mins.)[*5] | 5 Mins. | 5 Mins. | 5 Mins. | 5 Mins. | 5 Mins. | 3 Mins. | 3 Mins. | 5 Mins. | 5 Mins. |
| Copper Foil's Peel Strength (lb/in) | 9 | 8.5 | 8.7 | 8.4 | 8.9 | 5.3 | 5.1 | 6.5 | 8.3 |

TABLE 1-continued

Formulas of Examples and Comparative Examples and Physical Properties of Prepreg and Substrate

| Item | Example | | | | | Comparative Example | | | |
|---|---|---|---|---|---|---|---|---|---|
| | 1 | 2 | 3 | 4 | 5 | 1 | 2 | 3 | 4 |
| Flame Retardancy (UL-94) | V0 | V0 | V0 | V0 | V0 | V0 | V0 | V0 | V0 |

Note:
*[1] The minimum melt viscosity is measured by Shimazu CFT-100 Flowmeter, temperature increasing speed = 1.75° C./min.
*[2] Measured by Laser Flash LFA-447, Modify ASTM E1461.
*[3] Measured by Differential Scanning Calorimeter (DSC).
*[4] Samples are heated in pressure cooker at 120° C. and 2 atm for 30 minutes, respectively.
*[5] Samples are heated by a pressure cooker at 120° C. and 2 atm for 30 minutes, respectively, and then immersed into a soldering pot of 288° C. Then the time where peeling appears on each said sample is recorded.
*[6] Viscosity of resin.

TABLE 2 appearance inspection for copper foil substrate obtained from Example 2 and Comparative Example 4

| Item | copper foil substrate of Example 2 made of resin composition contained Aluminum Oxide closer the actual packing curve of FIG. 1 | copper foil substrate of comparative example 4 made of resin composition contained available Aluminum Oxide DAW-300 closer the actual packing curve of FIG. 2 |
|---|---|---|
| filler | Aluminum oxide (different-sized Aluminum oxide) | |
| Explain | By compliance of Horsfield Packing Model, the resin contained highest density model of Aluminum oxide (Aluminum oxide 5 μm/0.5 μm = 9/1) | No compliance of Horsfield Packing Model, the resin contained available Aluminum oxide DAW-300, (Aluminum oxide 45 μm/5 μm = 5/5) |
| Appearance | | |
| Surface roughness (μm) |       Left  middle  right<br>Ra  0.768  0.770  0.783<br>Rz  2.860  2.918  2.850<br>Rt  4.644  4.890  4.941 |       Left  middle  right<br>Ra  0.875  0.730  0.806<br>Rz  3.152  2.495  2.870<br>Rt  5.808  4.002  5.253 |
| Prepreg's Minimum Melt Viscosity (g/cm × s) | 5,320 | 6,320 |
| Thermal conductivity (W/m · K) | 4.78 | 3.54 |
| Conclusion | 1. Due to different-sized Aluminum Oxide A and B by compliance of Horsfield Packing Mode, prepeg melt viscosity is lower and flowability is better, after pressing, appearance is uniform, no filler agglutinated.<br>2. Surface is uniform, the maximum roughness is closer. | 1. Due to aluminum oxide DAW-300 non-compliance of Horsfield Packing Mode, prepeg melt viscosity is higher and flowability is poor, after pressing, appearance is non-uniform (indicated by cycle), and filler agglutinated.<br>2. Surface is non-uniform, the maximum roughness is dancing. |

Note:
Ra represents average roughness;
Rz represents average roughness of the maximum 10 points;
Rt represents the maximum roughness.

What is claimed is:

1. A resin composition having properties of a high thermal conductivity ranged from 5.7 W/m·K to 14.2 W/m·K as well as a high glass transition temperature ranged from 169° C. to 235° C. measured by differential scanning calorimetry (DSC), comprising:

(1) solid brominated epoxy resin of 20-70 wt % based on the resin composition, wherein the brominated epoxy resin comprises tetrabromobisphenol-A and at least one resin selected from the group consisting of multifunctional phenol-benzaldehyde epoxy resin, difunctional epoxy resin and difunctional bromine-containing epoxy resin;
(2) a hardener of 1-10 wt % based on the resin composition;
(3) a promoter of 0.1-10 wt % based on the resin composition;
(4) an inorganic powder of 0.01-20 wt % based on the resin composition to increase rigidity of the resin composition after cured, wherein the inorganic powder having a diameter of 0.01-20 micron is at least one selected from the group consisting of $SiO_2$, $TiO_2$, $Al(OH)_3$, $Mg(OH)_3$ and $CaCO_3$ in form of sphere or irregular shapes;
(5) different sizes of high thermal conductivity powders having a diameter of 0.1-10 micron that are closest packed in form of highest density model by Horsfield packing model and present in the resin composition in an amount of 5-85 wt % based on the resin composition, wherein the high thermal conductivity powder is at least one selected from the group consisting of metal nitrides, metal oxides, carbides and corundum; and
(6) a processing aid of 0.02-10 wt % if necessary added, based on the resin composition.

2. The resin composition as claimed in claim 1, wherein the resin composition contains different sizes of high thermal conductivity powders, closest packed in form of highest density model by Horsfield packing model, range from 65 wt % to 85 wt %.

3. The resin composition as claimed in claim 1, wherein the resin composition has properties of a high thermal conductivity ranged from 8.4 W/m·K to 14.2 W/m·K as well as a high glass transition temperature ranged from 169° C. to 235° C. measured by differential scanning calorimetry (DSC).

4. The resin composition as claimed in claim 1, wherein the promoter is at least one selected from the group consisting of tertiary amines and salts thereof, quaternary ammonium salts, 2,4,6-tris(dimethylaminomethyl)phenol, dimethyl benzylamine, imidazoles, tertiary amyl phenol ammonium, monophenols or polyphenols, boron trifluoride and organic complex compounds thereof, phosphoric acid and triphenyl phosphite.

5. The resin composition as claimed in claim 1, wherein the metal nitrides include aluminum nitride, boron nitride, and silicon nitride.

6. The resin composition as claimed in claim 1, wherein the metal oxides include aluminum oxide, magnesium oxide, and zinc oxide.

7. The resin composition as claimed in claim 1, wherein the carbides include silicon carbide and boron carbide.

8. The resin composition as claimed in claim 1, wherein the processing aid is at least one selected from the group consisting of stuffing, coupling agents, reinforcing fillers, plasticizers, dispersing agents, anti-oxidants, heat and light stabilizers, flame retardant agents, pigments and dyes.

9. A prepreg of high thermal conductivity for a printed circuit board, manufactured by retting a glass fiber cloth in the resin composition of claim 1.

10. A coating of high thermal conductivity for a printed circuit board, manufactured by coating a metal foil, a metal sheet or a plastic film with the resin composition of claim 1.

* * * * *